(12) United States Patent
Lee et al.

(10) Patent No.: US 11,791,372 B2
(45) Date of Patent: Oct. 17, 2023

(54) CAPACITORS OF SEMICONDUCTOR DEVICE CAPABLE OF OPERATING IN HIGH FREQUENCY OPERATION ENVIRONMENT

(71) Applicant: Samsung Electronics Co., Ltd., Suwon-si (KR)

(72) Inventors: Jaeho Lee, Seoul (KR); Boeun Park, Hwaseong-si (KR); Younggeun Park, Suwon-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 278 days.

(21) Appl. No.: 17/098,915

(22) Filed: Nov. 16, 2020

(65) Prior Publication Data
US 2021/0328004 A1    Oct. 21, 2021

(30) Foreign Application Priority Data
Apr. 21, 2020  (KR) .................. 10-2020-0048312

(51) Int. Cl.
*H01L 23/66*   (2006.01)
*H01L 49/02*   (2006.01)

(52) U.S. Cl.
CPC .............. *H01L 28/56* (2013.01); *H01L 23/66* (2013.01); *H01L 28/75* (2013.01); *H01L 2223/6661* (2013.01)

(58) Field of Classification Search
CPC ......... H01L 28/56; H01L 23/66; H01L 28/75; H01L 2223/6661; H01G 4/30; H01G 4/012; H01G 4/1227; H01G 4/2325; H01G 4/1209; H01G 4/228; H01G 4/306; H01G 4/248; H01G 4/1218
See application file for complete search history.

(56) References Cited

U.S. PATENT DOCUMENTS

| 7,148,530 | B2 | 12/2006 | Shin et al. |
| 7,799,631 | B2 | 9/2010 | Park |
| 8,085,523 | B2 | 12/2011 | Kato et al. |
| 2003/0039813 | A1* | 2/2003 | Kitai ................. C09K 11/7729 313/503 |

(Continued)

FOREIGN PATENT DOCUMENTS

| JP | 2004-241756 A | 8/2004 |
| JP | 2008-034417 A | 2/2008 |

(Continued)

*Primary Examiner* — Michael P McFadden
(74) *Attorney, Agent, or Firm* — HARNESS, DICKEY & PIERCE, P.L.C.

(57) ABSTRACT

Provided are capacitors of semiconductor devices, wherein the capacitors may be used in a high-frequency operation environment. A capacitor includes a first electrode layer, a dielectric layer on the first electrode layer, and a second electrode layer on the dielectric layer, wherein the dielectric layer includes a plurality of unit dielectric layers, and the unit dielectric layer includes first and second sub-dielectric layers that have different dielectric constants and conductivities from each other and are connected in series, and the first and second sub-dielectric layers have a conductivity difference so that the capacitance of the dielectric layer converges to the capacitance of the unit dielectric layer.

15 Claims, 6 Drawing Sheets

(56) References Cited

U.S. PATENT DOCUMENTS

| | | | |
|---|---|---|---|
| 2004/0155272 A1* | 8/2004 | Shin | H01L 28/56 |
| | | | 257/295 |
| 2008/0160712 A1* | 7/2008 | Park | H01G 4/10 |
| | | | 361/313 |
| 2010/0226067 A1* | 9/2010 | Osada | H01L 21/022 |
| | | | 156/60 |
| 2011/0235233 A1* | 9/2011 | Ando | H01G 4/1227 |
| | | | 361/301.4 |
| 2014/0071586 A1* | 3/2014 | Park | H01G 4/30 |
| | | | 156/60 |
| 2014/0150966 A1* | 6/2014 | Osada | H01L 28/56 |
| | | | 156/60 |
| 2019/0131075 A1* | 5/2019 | Park | H01G 4/1227 |
| 2021/0358694 A1 | 11/2021 | Lee et al. | |

FOREIGN PATENT DOCUMENTS

| | | |
|---|---|---|
| JP | 2008-034418 A | 2/2008 |
| KR | 10-0818657 | 4/2008 |

* cited by examiner

CAPACITORS OF SEMICONDUCTOR DEVICE CAPABLE OF OPERATING IN HIGH FREQUENCY OPERATION ENVIRONMENT

CROSS-REFERENCE TO RELATED APPLICATION

This application claims the benefit of Korean Patent Application No. 10-2020-0048312, filed on Apr. 21, 2020, in the Korean Intellectual Property Office, the disclosure of which is incorporated herein in its entirety by reference.

BACKGROUND

1. Field

The present disclosure relates to semiconductor devices, and more particularly, to capacitors of semiconductor devices capable of operating in a high-frequency operation environment.

2. Description of Related Art

As the integration degree of semiconductor devices increases, the thickness of a dielectric film may be reduced to a nanometer level. As the thickness of the dielectric film is reduced, not only the capacitance of a capacitor including the dielectric film may increase, but also a leakage current may also increase. In addition, an operation frequency of semiconductor devices including and/or connected to a capacitor, such as DRAM or transistor, may affect the capacitance of the capacitor.

SUMMARY

Provided are capacitors of a semiconductor device configured to be used in a high-frequency operation environment.

Additional aspects will be set forth in part in the description which follows and, in part, will be apparent from the description, or may be learned by practice of the presented example embodiments of the disclosure.

According to some example embodiments, a capacitor includes a first electrode layer, a dielectric layer on the first electrode layer, and a second electrode layer on the dielectric layer, wherein the dielectric layer includes a plurality of unit dielectric layers, the plurality of unit dielectric layer may include a first sub-dielectric layer and a second sub-dielectric layer, the first sub-dielectric layer and the second sub-dielectric layer may have different dielectric constants and conductivities and may be connected in series, and the capacitance of the dielectric layer may converge to the capacitance of the unit dielectric layer as a result of a conductivity difference between the first and second sub-dielectric layers.

The difference in conductivity between one of the first and second sub-dielectric layers and the other one may be 10 times or more. The dielectric layer may have a dielectric constant of about 1,000 or less. A sub-dielectric layer of the first and second sub-dielectric layers, having lower conductivity of the first and second sub-dielectric layers, may have a dielectric constant greater than that of the other sub-dielectric layer having higher conductivity. The dielectric layer may include 2 to 4 unit dielectric layers that are sequentially stacked.

According to some example embodiments, one of the first and second sub-dielectric layers may include a non-perovskite structure, and the other one include an $ABO_3$-based perovskite structure. The non-perovskite structure may include a metal oxide layer including at least one of Hf, Zr, Nb, and Al. $ABO_3$, 'A' may be at least one of Sr, Ba, Bi, and La and 'B' may be at least one of Ti, Ta, Ru, Hf, Zr, and Mo. The dielectric layer may include a ferroelectric layer, a paraelectric layer, and/or an anti-ferroelectric layer.

According to some example embodiments, the dielectric layer may have a thickness of about 12 nm or less. In some example embodiments, the dielectric layer may have a thickness of about 10 nm or less. The dielectric layer may have a dielectric constant in a range of about 100 to about 1,000. According to some example embodiments, the dielectric layer may have a thickness of about 5 nm or less and may have a dielectric constant of 50 to 100.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
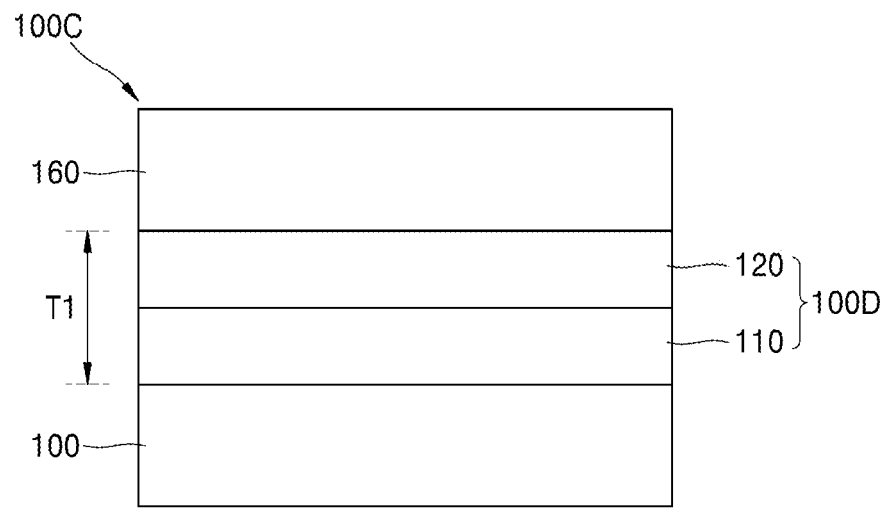
FIG. 1 is a cross-sectional view of a capacitor of a semiconductor device that may be used in a high-frequency operation environment, according to some example embodiments.

Reference will now be made in detail to sine example embodiments, some of which are illustrated in the accompanying drawings, wherein like reference numerals refer to like elements throughout. In this regard, the present embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a capacitor of a semiconductor device that may be used in a high-frequency operation environment according to some example embodiments will be described in detail with reference to the accompanying drawings. In the drawings, the thickness of the layers or regions shown may be somewhat exaggerated for clarity of specification. The following example embodiments described below are merely illustrative, and various modifications may be possible from some example embodiments of the present disclosure. When an element or layer is referred to as being "on" or "above" another element or layer, the element or layer may be directly on another element or layer or intervening elements or layers.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes and/or configurations, it is intended that precision of the geometric shape and/or configuration is not required but that latitude for the shape and/or configuration is within the scope of the disclosure. Further, regardless of whether numerical values, shapes, and/or configurations are modified as "about" or "substantially," it will be understood that these values and shapes should be construed as including a manufacturing or operational tolerance (e.g., ±10%) around the stated numerical values, shape, and/or configurations.

FIG. 1 shows a first capacitor 100C of a semiconductor device that may be used in a high-frequency operation environment, according to an example embodiment.

Referring to FIG. 1, the first capacitor 100C includes a first electrode layer 100, a dielectric layer 100D, and a second electrode layer 160. The first electrode layer 100, the dielectric layer 100D, and the second electrode layer 160 are sequentially stacked. One of the first electrode layer 100 and the second electrode layer 160 may be a lower electrode of the first capacitor 100C, and the other may be an upper electrode. The dielectric layer 100D may include first and second unit dielectric layers 110 and 120 that are sequentially stacked. Each of the first and second unit dielectric layers 110 and 120 may include multiple layers, and the layer configurations of the multiple layers may be substantially identical to each other, which will be described later. The thickness T1 of the dielectric layer 100D may be the same as a separation distance between the first electrode layer 100 and the second electrode layer 160. The thickness T1 of the dielectric layer 100D may be tens of nanometers or less. For example, a thickness T1 of the dielectric layer 100D may be about 10 nm or less. In another example, the thickness T1 of the dielectric layer 100D may be about 5 nm or less. The thickness of the dielectric layer may be constant.

As the thickness T1 of the dielectric layer 100D is so small, the dielectric layer 100D may have conductivity. In one example, the dielectric layer 100D may include a ferroelectric layer, a paraelectric layer, and/or an anti-ferroelectric layer. In one example, the dielectric layer 100D may include a non-perovskite and/or a perovskite structure. For the example, the dielectric layer 100D may include a dielectric layer having a non-perovskite structure and/or a dielectric layer having a perovskite structure. In one example, a dielectric layer having the non-perovskite structure may be a metal oxide layer including a metal, such as hafnium (Hf), zirconium (Zr), niobium (Nb), or aluminum (Al). The dielectric layer having the non-perovskite structure may include the metal oxide layer. In one example, the dielectric layer having the perovskite structure may be a dielectric layer having an $ABO_3$-based structure or may include the dielectric layer having the $ABO_3$-based structure. In $ABO_3$-based structure, 'A' may be, for example, strontium (Sr), barium (Ba), bismuth (Bi) and/or lanthanum (La); 'B' may be, for example, titanium (Ti), tantalum (Ta), ruthenium (Ru), hafnium (Hf), zirconium (Zr), and/or molybdenum (Mo); and 'O' is oxygen.

Figure 2:
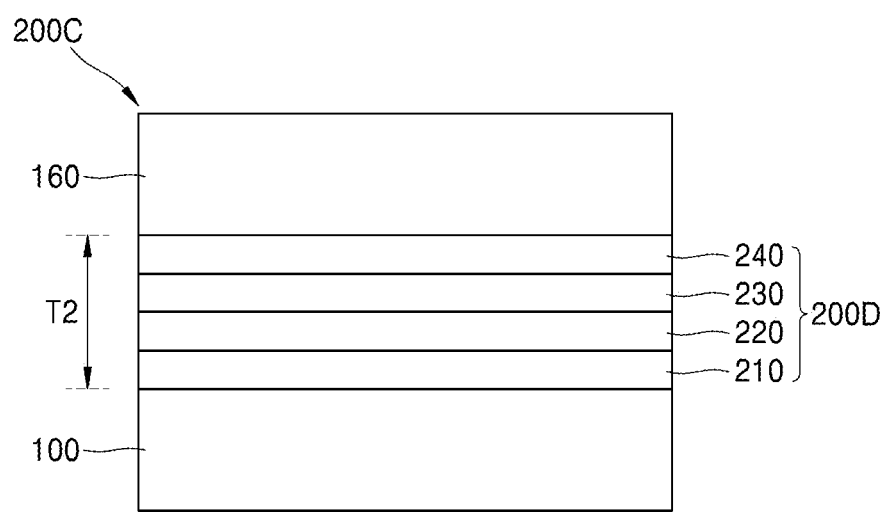
FIG. 2 is a cross-sectional view of a capacitor of a semiconductor device that may be used in a high-frequency operation environment, according to some example embodiments.

FIG. 2 shows a second capacitor 200C of a semiconductor device according to an example embodiment.

Referring to FIG. 2, the second capacitor 200C includes a first electrode layer 100, a dielectric layer 200D, and a second electrode layer 160. The dielectric layer 200D may include first to fourth unit dielectric layers 210, 220, 230, and 240 that are sequentially stacked. The thickness T2 of the dielectric layer 200D may be the same as the thickness T1 of the dielectric layer 100D of FIG. 1. The first to fourth unit dielectric layers 210, 220, 230, and 240 may have substantially the same layer configuration to each other. The first to fourth unit dielectric layers 210, 220, 230, 240 may have substantially the same thickness to each other. For example, the second to fourth unit dielectric layers 220, 230, and 240 may be formed by repeatedly stacking the first unit dielectric layer 210.

The first to fourth unit dielectric layers 210, 220, 230, 240 may include a ferroelectric layer, a paraelectric layer, and/or an anti-ferroelectric layer. In one example, the dielectric layer 100D may include a dielectric layer having a non-perovskite structure and/or a dielectric layer having a perovskite structure. In one example, a dielectric layer having the non-perovskite structure may be a metal oxide layer including a metal, such as hafnium (Hf), zirconium (Zr), niobium (Nb), or aluminum (Al). The dielectric layer having the non-perovskite structure may include the metal oxide layer. In one example, the dielectric layer having the perovskite structure may be a dielectric layer having an $ABO_3$-based structure or may include the dielectric layer having the $ABO_3$-based structure. In $ABO_3$-based structure, 'A' may be, for example, strontium (Sr), barium (Ba), bismuth (Bi) and/or lanthanum (La); 'B' may be, for example, titanium (Ti), tantalum (Ta), ruthenium (Ru), hafnium (Hf), zirconium (Zr), and/or molybdenum (Mo); and 'O' is oxygen.

Figure 3:
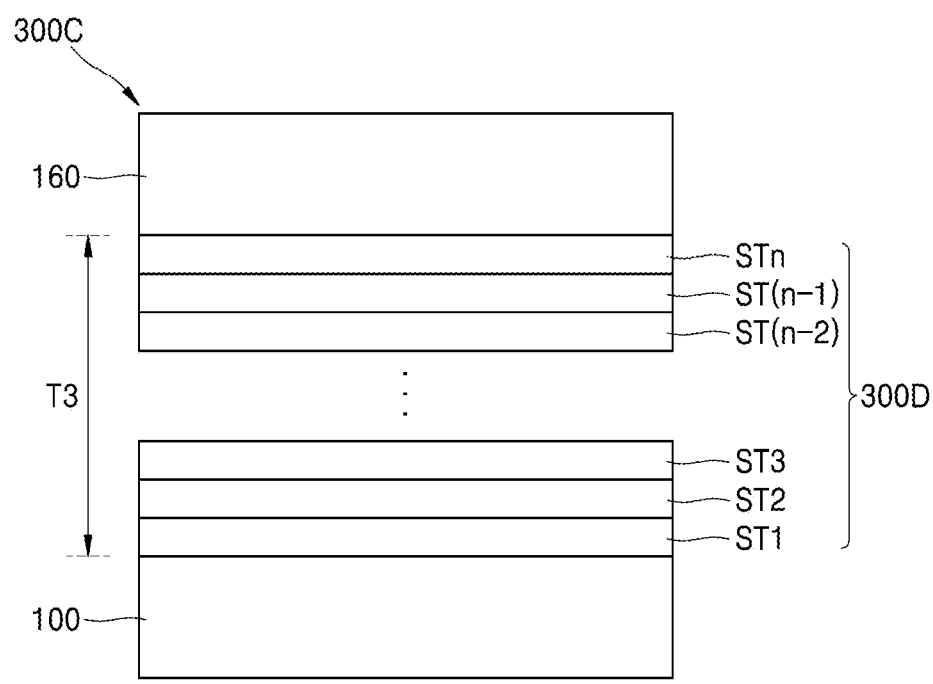
FIG. 3 is a cross-sectional view of a capacitor of a semiconductor device that may be used in a high-frequency operation environment, according to some example embodiments.

FIG. 3 shows a third capacitor 300C of a semiconductor device that may be used in a high-frequency operation environment, according to an example embodiment.

Referring to FIG. 3, the third capacitor 300C includes a first electrode layer 100, a dielectric layer 300D, and a second electrode layer 160. The dielectric layer 300D may include sequentially stacked n unit dielectric layers ST1, ST2, ST3 . . . ST(n−2), ST(n−1), and ST(n), (where n=1, 2, 3 . . . ). A thickness T3 of the dielectric layer 300D may be the same as the thickness T1 of the dielectric layer 100D of FIG. 1 and/or the dielectric layer 200D of FIG. 2.

As a result, the thicknesses T1, T2, and T3 of the dielectric layers 100D, 200D, and 300D in the first to third capacitors 100C, 200C, and 300C may be kept constant.

The n unit dielectric layers ST1, ST2, ST3 . . . ST(n−2), ST(n−1), and ST(n) constituting the dielectric layer 300D may have the same layer structure, and may have the same thickness to each layer. The second to $n^{th}$ unit dielectric layers ST2, ST3 . . . ST(n−2), ST(n−1), and ST(n) may be formed by repeatedly stacking the first unit dielectric layer ST1.

Figure 4:
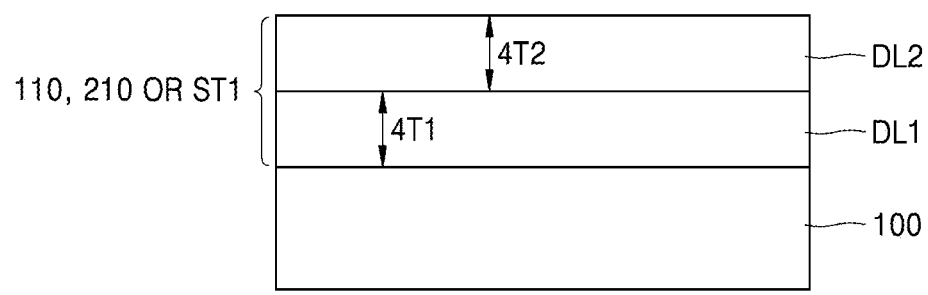
FIG. 4 is a cross-sectional view illustrating an example of a layer structure of a unit dielectric layer of dielectric layers of the first to third capacitors illustrated in FIGS. 1, 2, and 3, according to some example embodiments.

FIG. 4 shows an example of a layer configuration of the unit dielectric layer (e.g., the first unit dielectric layer 110 of FIG. 1, the first unit dielectric layer 210 of FIG. 2, and the first unit dielectric layer ST1 of FIG. 3) of the dielectric layers 100D, 200D, and 300D of the first to third capacitors 100C, 200C, and 300C shown in FIGS. 1 to 3.

Referring to FIG. 4, the first unit dielectric layers 110, 210 or ST1 of the first to third capacitors 100C, 200C, and 300C of FIGS. 1 to 3 include a first sub-dielectric layers DL1 and a second sub-dielectric layer DL2 that are sequentially stacked. The first sub-dielectric layer DL1 has a first thickness 4T1. The second sub-dielectric layer DL2 has a second thickness 4T2. The first thickness 4T1 and the second thickness 4T2 may be different from each other. The first sub-dielectric layer DL1 may include a dielectric layer having the non-perovskite structure or a dielectric layer having the perovskite structure. The second sub-dielectric layer DL2 may include the dielectric layer having a non-perovskite structure or a dielectric layer of the perovskite structure. For example, one of the first sub-dielectric layer DL1 or the second sub-dielectric layer DL2 may include a non-perovskite structure, with the remaining sub-dielectric layer including a perovskite structure. The dielectric constant of a capacitor including the first sub-dielectric layer DL1 and the second sub-dielectric layer DL2 connected in series may be 50 or more.

For example, when the thickness T2 of the dielectric layer 200D of FIG. 2 is 10 nm or less, the dielectric constant of a capacitor including the first and second sub-dielectric layers DL1 and DL2 connected in series may be in a range of about 100 to about 1,000. In this case, the leakage current of the capacitor may be in a range of 1 $\mu A/cm^2$ to 1 $pA/cm^2$.

In an example embodiment, when the thickness T2 of the dielectric layer 200D of FIG. 2 is 5 nm or less, the dielectric constant of the capacitor including the first and second sub-dielectric layers DL1 and DL2 connected in series may be in a range of about 50 to about 100. In this case, the leakage current of the capacitor may be in a range of 1 $\mu A/cm^2$ to 1 $pA/cm^2$. In an example embodiment, the thicknesses 4T1 and 4T2 of the first and second sub-dielectric layers DL1 and DL2 may be less than 10 nm, respectively.

The first sub-dielectric layer DL1 may have a first conductivity. The second sub-dielectric layer DL2 may have a second conductivity. The magnitude of the first conductivity may be different from that of the second conductivity. Here, the conductivity may be defined as a change in current of each of the first and second sub-dielectric layers DL1, DL2 according to a voltage applied to each of the first and second sub-dielectric layers DL1, DL2. A ratio between one of the first conductivity and the second conductivity and the other one may be 1:10 or more. For example, the first conductivity may be 10 or more times greater than the second conductivity, 10 or more times greater than a product of an operating frequency and capacitance of the first sub-dielectric layer DL1, and/or 10 or more times greater than a product of an operating frequency and capacitance of the second sub-dielectric layer DL2. In an example embodiment, the second conductivity may be 10 or more times greater than the first conductivity, 10 or more times greater than a product of the operating frequency and capacitance of the first sub-dielectric layer DL1, and 10 or more times greater than a product of the operating frequency and capacitance of the second sub-dielectric layer DL2. The operating frequencies may be the same.

Figure 5:
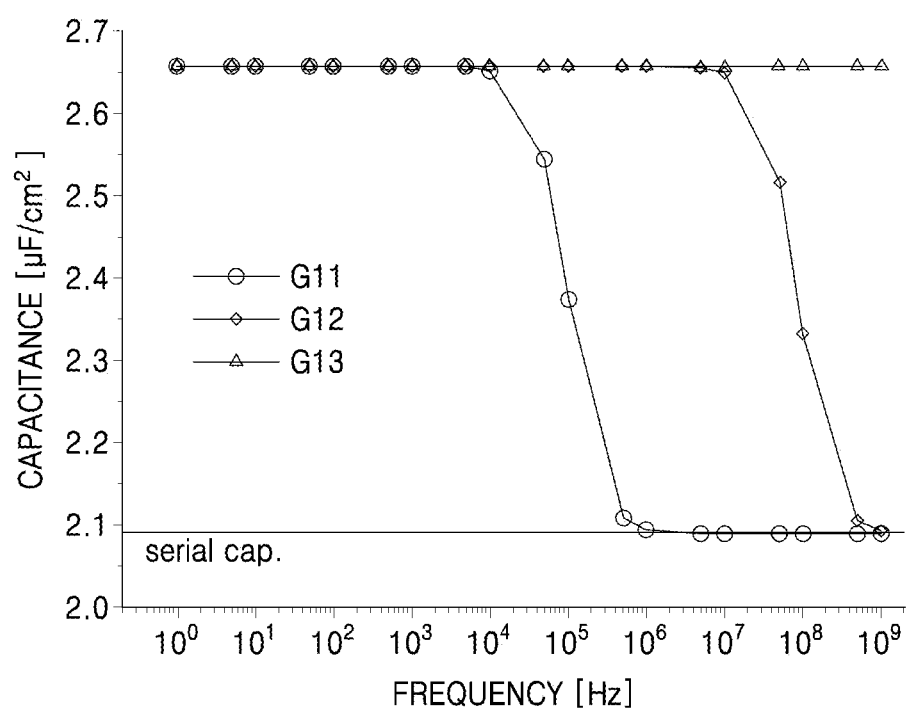
FIG. 5 is a graph showing a frequency-capacitance relationship according to a layer configuration of a unit dielectric layer of a dielectric layer of a capacitor according to some example embodiments.

FIG. 5 is a graph showing a frequency-capacitance relationship according to a layer configuration of a unit dielectric layer of a dielectric layer of a capacitor according to some example embodiments.

In FIG. 5, the horizontal axis represents frequency applied to the capacitor and the vertical axis represents capacitance. The frequency may be in an operating frequency range of the semiconductor device (e.g., DRAM or transistor) associated with the capacitor disclosed herein. The operating frequency may be in a range of hundreds of MHz to several tens of GHz.

In FIG. 5, a first graph G11 shows a result of a capacitor including one unit dielectric layer as a dielectric layer.

In FIG. 5, a second graph G12 shows a result of a capacitor including two unit dielectric layers as a dielectric layer.

In FIG. 5, a third graph G13 shows a result of a capacitor including four unit dielectric layers as a dielectric layer.

Figure 6:
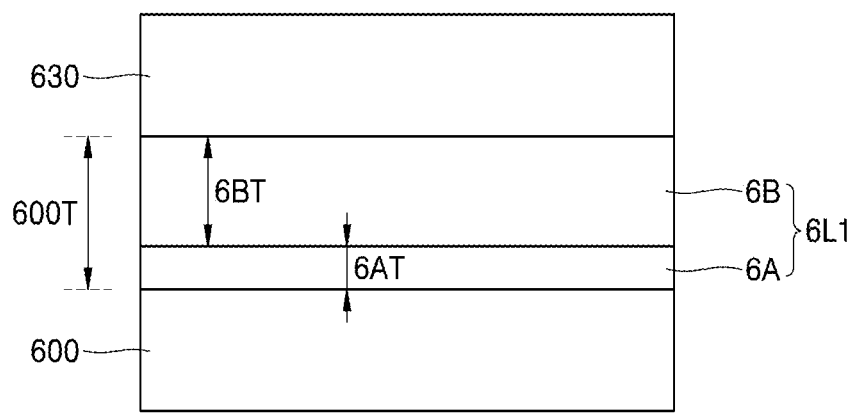
FIG. 6 is a cross-sectional view of a capacitor used to obtain the results shown in the first graph G11 of FIG. 5.

FIG. 6 shows a capacitor used to obtain the results shown in the first graph G11 of FIG. 5.

Referring to FIG. 6, the capacitor may include a dielectric layer 6L1 including first and second sub-dielectric layers 6A and 6B sequentially stacked on a lower electrode 600. An upper electrode 630 is on the dielectric layer 6L1. The thickness 600T of the dielectric layer 6L1 may be equal to the sum of the thickness 6AT of the first sub-dielectric layer 6A and the thickness 6BT of the second sub-dielectric layer 6B. The first sub-dielectric layer 6A may have a dielectric constant of about 30 and the thickness 6AT of about 2 nm. The second sub-dielectric layer 6B may have a dielectric constant of about 22 and the thickness 6BT of the second sub-dielectric layer 6B may be about 10 nm. Accordingly, the thickness 600T of the dielectric layer 6L1 may be about 12 nm.

Figure 7:
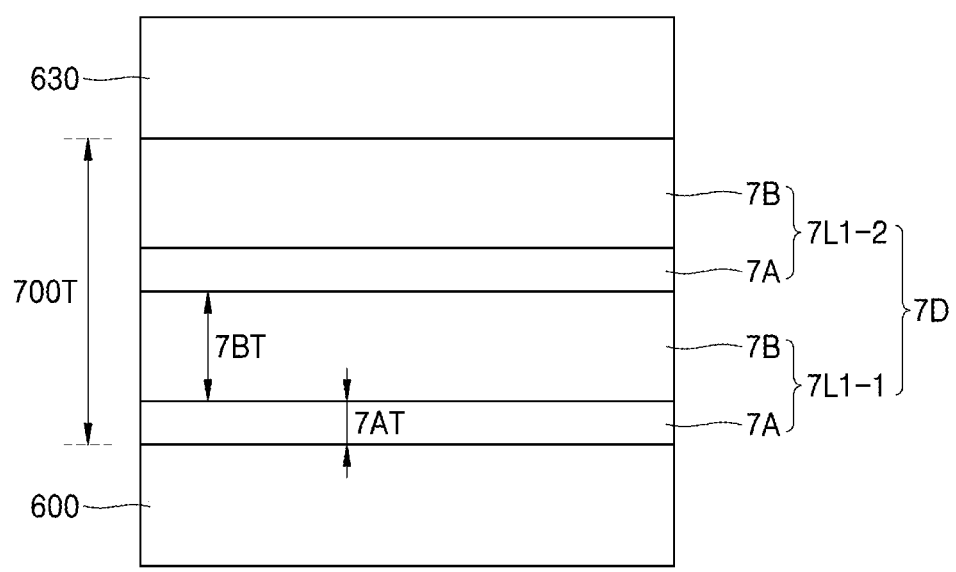
FIG. 7 is a cross-sectional view of a capacitor used to obtain the results shown in the second graph G12 of FIG. 5.

FIG. 7 shows a capacitor used to obtain the results shown in the second graph G12 of FIG. 5.

Referring to FIG. 7, two unit dielectric layers 7L1-1 and 7L1-2 are sequentially stacked on the lower electrode 600. The first and second sub-dielectric layers 7A and 7B may be alternately stacked two times in sequence. An upper electrode 630 is on the second unit dielectric layer 7L1-2. The thickness 700T of the dielectric layer 7D between the upper electrode 630 and the lower electrode 600 may be the same as the thickness 600T of the dielectric layer 6L1 of FIG. 6. The thickness 7AT of the first sub-dielectric layer 7A of each unit dielectric layer 7L1-1 and 7L1-2 may be about 1 nm, and the thickness 7BT of the second sub-dielectric layer 7B may be about 5 nm. Accordingly, the thickness 700T of the entire dielectric layer 7D may be about 12 nm, as in the case of FIG. 6. The first sub-dielectric layer 7A may have a dielectric constant as the same as that of the first sub-dielectric layer 6A of FIG. 6. The second sub-dielectric layer 7B may also have a dielectric constant as the same as that of the second sub-dielectric layer 6B of FIG. 6.

Figure 8:
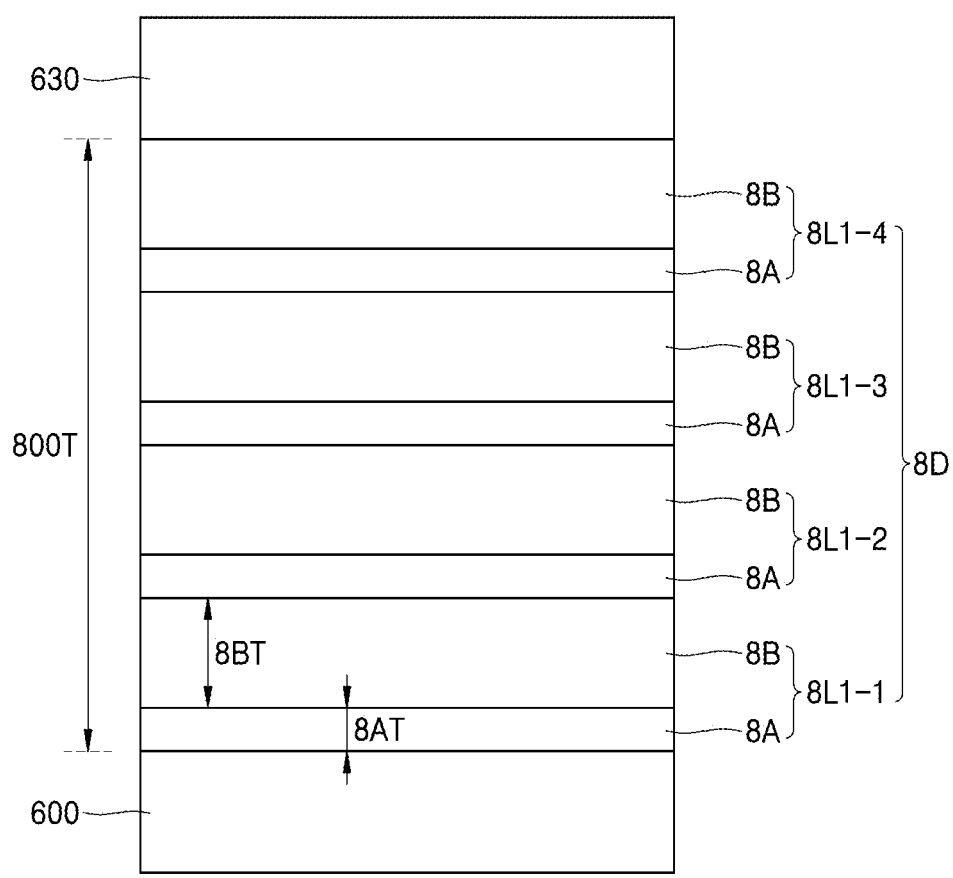
FIG. 8 is a cross-sectional view of a capacitor used to obtain the results shown in the third graph G13 of FIG. 5.

FIG. 8 shows a capacitor used to obtain the results shown in the third graph G13 of FIG. 5.

Referring to FIG. 8, four unit dielectric layers 8L1-1, 8L1-2, 8L1-3, and 8L1-4 are sequentially stacked on a lower electrode 600. For example, the same layer structure may be formed by sequentially and alternately stacking first and second sub-dielectric layers 8A and 8B four times. An upper electrode 630 is present on the uppermost unit dielectric layer 8L1-4. The thickness 800T of the dielectric layer 8D provided between the upper electrode 630 and the lower electrode 600 may be the same as the thickness 600T of the dielectric layer 6L1 of FIG. 6. The first sub-dielectric layer 8A of each unit dielectric layer 8L1 may have a thickness 8AT of about 0.5 nm, and the second sub-dielectric layer 8B may have a thickness 8BT of about 2.5 nm. Accordingly, the thickness 800T of the entire dielectric layer 8D may be about 12 nm, as in the case of FIG. 6. The first sub-dielectric layer 8A may have a dielectric constant as the same as that of the first sub-dielectric layer 6A of FIG. 6. The second sub-dielectric layer 8B may also have a dielectric constant as the same as that of the second sub-dielectric layer 6B of FIG. 6.

When the first to third graphs G11, G12, and G13 of FIG. 5 are compared with each other, as the operation frequency applied to the capacitor increases, a decrease in capacitance appears first in the first graph G11. After the capacitance decrease appears in the first graph G11, if the operating frequency is continuously increased, the first graph G11 reaches the lowest capacitance, and, also, a decrease in capacitance appears in the second graph G12. The lowest capacitance may be capacitance of two capacitors when the two capacitors with a dielectric layer having no conductivity are connected in series and the capacitance of one of the capacitors is much greater than that of the other one. Thereafter, if the operating frequency is continuously increased, the second graph G12 also reaches the lowest capacitance. Even after the second graph G12 reaches the lowest capacitance, the third graph G13 maintains the initial high capacitance.

When the dielectric layers 7D and 8D of the capacitor include at least two or more unit dielectric layers 7L1-1 and 7L1-2 and 8L1-1 to 8L1-4 as illustrated in FIGS. 7 and 8, for example, when a dielectric layer is formed by alternately stacking two or more times the first and second sub-dielectric layers (7A and 7B of FIGS. 7 and 8A and 8B of FIG. 8), FIG. 5 shows that the capacitor may maintain an appropriate capacitance even in a high operating frequency environment.

In other words, the result of FIG. 5 suggests that the capacitor according to an example embodiment may be normally used in a semiconductor device used in a high-frequency operation environment.

Figure 9:
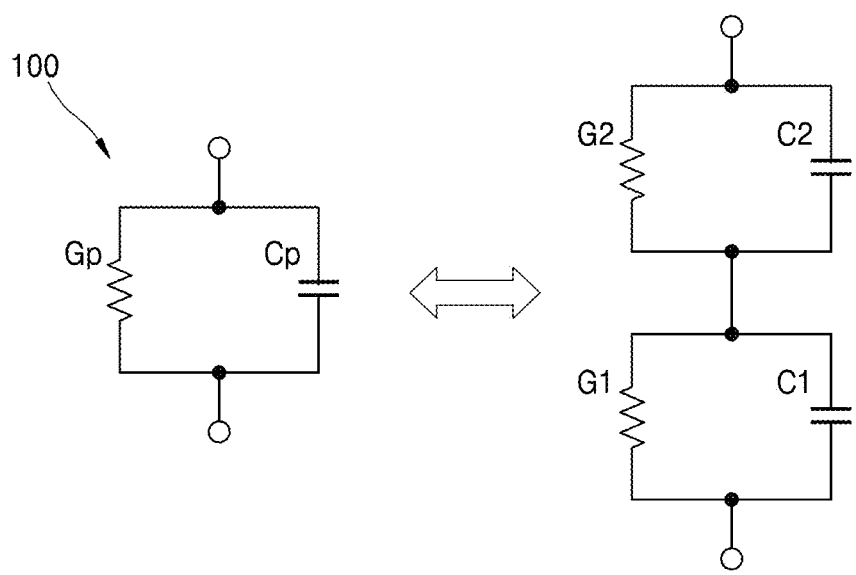
FIG. 9 is an equivalent circuit showing a case when a dielectric layer of a capacitor includes one unit dielectric layer, according to some example embodiments.

FIG. 9 shows an equivalent circuit when a dielectric layer of a capacitor according to an example embodiment includes one unit dielectric layer (e.g., the first unit dielectric layer 110 of FIG. 1).

An RC circuit 9C1 on the left in FIG. 9 shows an equivalent circuit for a capacitor having one unit dielectric layer (the first unit dielectric layer 110 in FIG. 4). A first RC circuit 9C1a on the right side in FIG. 9 shows an equivalent circuit for the first sub-dielectric layer (DL1 in FIG. 4) of one unit dielectric layer 110. A second RC circuit 9C1b on the right shows an equivalent circuit for the second sub-dielectric layer (DL2 in FIG. 4) of one unit dielectric layer 110.

In FIG. 9, "Gp" denotes conductivity of one unit dielectric layer, and Cp denotes total capacitance of one unit dielectric layer. Also, "G1" represents first conductivity of the first sub-dielectric layer DL1, and "G2" represents second conductivity of the second sub-dielectric layer DL2. In addition, "C1" represents capacitance component for the first sub-dielectric layer DL1, and "C2" represents capacitance component for the second sub-dielectric layer DL2.

Like the case of the capacitors 100C, 200C, and 300C shown in FIGS. 1 to 3, when each of the dielectric layers 100D, 200D, and 300D include a plurality of unit dielectric layers, the equivalent circuit of the capacitors 100C, 200C, and 300C of FIGS. 1 to 3 may be the same as that obtained by connecting the plurality of equivalent circuits in FIG. 9 in series.

For the equivalent circuit of FIG. 9, the capacitance (Cp) may be expressed by Equation 1 below.

$$C_p = \frac{C_2(G_1^2 + \omega^2 C_1^2) + C_1(G_2^2 + \omega^2 C_2^2)}{(G_1 + G_2)^2 + \omega^2(C_1 + C_2)^2} \qquad \langle\text{Equation 1}\rangle$$

In Equation 1, ω represents the operating frequency.

In Equation 1, if G1, G2<<ωC1, ωC2, Cp may be approximated by Equation 2 below.

$$C_p = \frac{\omega^2 C_1^2 C_2 + \omega^2 C_2^2 C_1}{\omega^2 (C_1 + C_2)^2} = \frac{C_1 C_2}{C_1 + C_2} \qquad \langle\text{Equation 2}\rangle$$

In Equation 2, if $C_1 \ll C_2$, Cp is C1. That is, the total capacitance Cp converges to the minimum capacitance C1. That is, Cp is equal to C1.

In Equation 1, G1≥G2, G1≥ωC₁ and G1≥ωC₂ and when G1>>G2, Cp is $C_2$ as shown in Equation 3 below. That is, the capacitance Cp of the first unit dielectric layer 110 including the first and second sub-dielectric layers DL1 and DL2 converges to the capacitance $C_2$ of a sub-dielectric layer having a low conductivity.

$$C_p = \frac{C_2 G_1^2 + C_1 C_2^2}{G_1^2} = C_2 + C_1 \frac{G_2^2}{G_1^2} \approx C_2 \qquad \langle\text{Equation 3}\rangle$$

When Cp becomes $C_2$, Cp may be expressed as Equation 4 below.

$$C_p \approx C_2 = \epsilon_0 \epsilon_r \frac{A}{t_2} = \epsilon_0 \epsilon' \frac{A}{t_1 + t_2} \qquad \langle\text{Equation 4}\rangle$$

$$\epsilon' = \epsilon_r \left(1 + \frac{t_1}{t_2}\right)$$

In Equation 4, $t_1$ and $t_2$ may correspond to the thicknesses 4T1 and 4T2 of the first sub-dielectric layer DL1 and the second sub-dielectric layer DL2, respectively.

The dielectric constant ε' may be increased by controlling a ratio of the thicknesses 4T1 and 4T2 of the first and second sub-dielectric layers DL1 and DL2 from Equation 4, and finally, the boosting of the capacitance (Cp) may be possible.

When a dielectric layer includes two or more unit dielectric layers, for example, if the first and second sub-dielectric layers are alternately stacked two or more times, Equation 5 shows that the total capacitance ($C_{2t}$, $C_{3t}$, and $C_{nt}$) of a capacitor is equal to the capacitance (Cp) when a dielectric layer includes one unit dielectric layer.

$$\begin{aligned} C_{2t} &= \frac{C_{2p}(G_{2p}^2 + \omega C_{2p}^2) + C_{2p}(G_{2p}^2 + \omega C_{2p}^2)}{(G_{2p} + G_{2p})^2 + \omega^2(C_{2p} + C_{2p})^2} \qquad \langle\text{Equation 5}\rangle \\ &= \frac{2C_{2p}(G_{2p}^2 + \omega C_{2p}^2)}{4(G_{2p}^2 + \omega C_{2p}^2)} = \frac{C_{2p}}{2} \\ &= Cp\left(C_{2p} = \epsilon_{0\epsilon'} \frac{A}{t/2} = 2Cp\right) \end{aligned}$$

-continued $$C_{3t} = \frac{C_{3p}((G_{3p}/2)^2 + \omega(C_{3p}/2)^2) + (G_{3p}/2)(G_{3p}^2 + \omega C_{3p}^2)}{(G_{3p} + (G_{3p}/2))^2 + \omega^2(C_{3p} + (C_{3p}/2))^2}$$

$$= \frac{(3/4)C_{3p}(G_{3p}^2 + \omega C_{3p}^2)}{(9/4)(G_{3p}^2 + \omega C_{3p}^2)}$$

$$= \frac{C_{3p}}{3}$$

$$C_{3p} = \epsilon_{0e'} \frac{A}{t/3} = 3Cp, \quad C_{3t} = Cp$$

$$C_{nt} = \frac{C_{np}}{n} = \epsilon_{0e'} \frac{A}{t/n} \bigg/ n = Cp,$$

In Equation 5, $C_{2t}$ represents the total capacitance of a capacitor in which a dielectric layer includes two unit dielectric layers. $C_{3t}$ represents the total capacitance of a capacitor in which a dielectric layer includes three unit dielectric layers. $C_{nt}$ represents the total capacitance of a capacitor in which a dielectric layer includes n unit dielectric layers.

By considering the above results and the results of FIG. 5 together, it may be seen that the capacitor may be used even in a high-frequency operation environment without reducing capacitance when the dielectric layer of the capacitor includes first and second sub-dielectric layers that are alternately stacked two or more times. According to an example embodiment, a capacitor of a semiconductor device that may be used in a high-frequency operation environment includes a dielectric layer formed by alternately stacking two dielectric layers having different dielectric constants and conductivity two or more times. An overall thickness of the dielectric layer may be kept constant at a few tens of nanometers (nm) or less regardless of the number of alternating stacks.

In the case of a capacitor of the related art, when an operating frequency of the semiconductor device is increased in a condition that the thickness of the dielectric layer of the capacitor is tens of nanometers or less, for example, 20 nm or less, the capacitance of the capacitor is rapidly reduced. However, when the dielectric layer of the capacitor has the layer structure described above, a limiting frequency at which the capacitance decreases may be increased. As the number of alternately stacking of the dielectric layer increases, the limiting frequency may also be increased.

Therefore, a capacitor according to an example embodiment may be used even when an operating frequency of the semiconductor device is high, that is, in a high-frequency operating environment, thus, the capacitor may provide a stable operation of a corresponding semiconductor device even in a high operating frequency environment.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A capacitor comprising:
a first electrode layer;
a dielectric layer on the first electrode layer; and
a second electrode layer on the dielectric layer,
wherein the dielectric layer comprises a plurality of unit dielectric layers sequentially stacked and configured to be in contact with each other, a first unit dielectric layer of the plurality of unit dielectric layers comprises two sub-dielectric layers, and a second unit dielectric layer of the plurality of unit dielectric layers comprises two sub-dielectric layers,
wherein the two sub-dielectric layers each comprise comprising a first sub-dielectric layer and a second sub-dielectric layer, the first sub-dielectric layer and the second sub-dielectric layer having different dielectric constants and conductivities, and are connected in series,
wherein the capacitance of the dielectric layer converges to the capacitance of the unit dielectric layer as a result of a conductivity difference between the first and second sub-dielectric layers, and
wherein thicknesses of the plurality of unit dielectric layers are the same with each other.

2. The capacitor of claim 1, wherein the difference in conductivity between one of the first and second sub-dielectric layers and the other one is 10 times or more.

3. The capacitor of claim 1, wherein the dielectric layer has a dielectric constant of 1,000 or less.

4. The capacitor of claim 1, wherein a sub-dielectric layer of the first and second sub-dielectric layers, having a lower conductivity, has a dielectric constant greater than that of the other sub-dielectric layer, having higher conductivity.

5. The capacitor of claim 1, wherein the dielectric layer comprises 2 to 4 unit dielectric layers that are sequentially stacked.

6. The capacitor of claim 1, wherein one of the first and second sub-dielectric layers includes a non-perovskite structure, and the other sub-dielectric layer includes an $ABO_3$-based perovskite structure.

7. The capacitor of claim 6, wherein the non-perovskite structure comprises a metal oxide layer including one of Hf, Zr, Nb, and Al.

8. The capacitor of claim 6, wherein, in $ABO_3$,
'A' is one of Sr, Ba, Bi, and La, and
'B' is one of Ti, Ta, Ru, Hf, Zr, and Mo.

9. The capacitor of claim 1, wherein the dielectric layer comprises one of a ferroelectric layer, a paraelectric layer, and an anti-ferroelectric layer.

10. The capacitor of claim 1, wherein the dielectric layer has a thickness of about 12 nm or less.

11. The capacitor of claim 10, wherein the dielectric layer has a thickness of about 10 nm or less.

12. The capacitor of claim 10, wherein the dielectric layer has a dielectric constant in a range of about 100 to about 1,000.

13. The capacitor of claim 1, wherein the dielectric layer has a thickness of about 5 nm or less and has a dielectric constant of about 50 to about 100.

14. The capacitor of claim 1, wherein the first sub-dielectric layer has a first thickness and the second sub-dielectric layer has a second thickness,
wherein the first thickness is less than the second thickness, a dielectric constant of the first sub-dielectric layer is greater than a dielectric constant of the second sub-dielectric layer, and a conductivity of the first sub-dielectric layer is 10 or more times greater than a conductivity of the second sub-dielectric layer.

15. The capacitor of claim 1, wherein an operation frequency-capacitance relationship of the capacitor exhibits a constant capacitance at operation frequencies of up $10^6$ hertz or more.

* * * * *